(12) United States Patent
Joshi et al.

(10) Patent No.: US 11,069,594 B2
(45) Date of Patent: Jul. 20, 2021

(54) METHODS OF FORMING ELECTRONIC ASSEMBLIES WITH INVERSE OPAL STRUCTURES USING VARIABLE CURRENT DENSITY ELECTROPLATING

(71) Applicants: Toyota Motor Engineering & Manufacturing North America, Inc., Plano, TX (US); The Board of Trustees of the University of Illinois, Champaign, IL (US)

(72) Inventors: Shailesh N. Joshi, Ann Arbor, MI (US); Paul Braun, Champaign, IL (US); Julia Kohanek, Champaign, IL (US); Gaurav Singhal, Maharashtra (IN)

(73) Assignees: Toyota Motor Engineering & Manufacturing North America, Inc., Plano, TX (US); The Board of Trustees of the University of Illinois, Champaign, IL (US)

( * ) Notice: Subject to any disclaimer, the term of this patent is extended or adjusted under 35 U.S.C. 154(b) by 16 days.

(21) Appl. No.: 16/696,183

(22) Filed: Nov. 26, 2019

(65) Prior Publication Data
US 2021/0159143 A1    May 27, 2021

(51) Int. Cl.
*H01L 23/373*    (2006.01)
*C23C 28/02*    (2006.01)
(Continued)

(52) U.S. Cl.
CPC ...... *H01L 23/3733* (2013.01); *B81C 1/00031* (2013.01); *C23C 28/027* (2013.01);
(Continued)

(58) Field of Classification Search
CPC . H01L 23/3733; H01L 21/4882; H01L 24/73; B81C 1/00031; C25D 5/02; C25D 5/48; C23C 28/027; C23C 28/028
See application file for complete search history.

(56) References Cited

U.S. PATENT DOCUMENTS 8,936,683 B2    1/2015    Marshall
9,601,234 B2    3/2017    King et al.
(Continued)

FOREIGN PATENT DOCUMENTS

| JP | 5587567 B2 | 8/2014 |
|---|---|---|
| KR | 101816800 B1 | 1/2018 |
| KR | 101824204 B1 | 1/2018 |

OTHER PUBLICATIONS

Enhanced heat transfer using microporous copper inverse opals, (https://www.researchgate.net/publication/326536762_Enhanced_Heat_Transfer_Using_Microporous_Copper_Inverse_Opals), May 2018.

*Primary Examiner* — Allen L Parker
*Assistant Examiner* — Gustavo G Ramallo
(74) *Attorney, Agent, or Firm* — Dinsmore & Shohl LLP

(57) ABSTRACT

A method of forming an inverse opal structure along a substrate that includes depositing polymer spheres along the substrate and electroplating the substrate and spheres at a first current density to form a first solid metal layer such that the spheres are raised from the substrate. The method includes electroplating the substrate and the spheres at a second current density to diffuse metals from the substrate and deposit the metal about the spheres. The second current density is greater than the first current density. The method includes electroplating the substrate and spheres to form a second solid metal layer disposed over the spheres, and removing the spheres to form the inverse opal structure disposed between the first and second solid metal layers. The
(Continued)

first and second solid metal layers define planar interface surfaces disposed over a porous structure of the inverse opal structure.

19 Claims, 5 Drawing Sheets

(51) Int. Cl.
    *C25D 5/02*         (2006.01)
    *H01L 21/48*      (2006.01)
    *B81C 1/00*       (2006.01)
    *C25D 5/48*       (2006.01)

(52) U.S. Cl.
    CPC .............. *C23C 28/028* (2013.01); *C25D 5/02* (2013.01); *C25D 5/48* (2013.01); *H01L 21/4882* (2013.01); *H01L 2221/68381* (2013.01)

(56) References Cited

U.S. PATENT DOCUMENTS

| | | | |
|---|---|---|---|
| 10,892,206 B2* | 1/2021 | Joshi | C25D 1/02 |
| 2014/0011014 A1* | 1/2014 | King | C25D 7/00 |
| | | | 428/312.2 |
| 2014/0111956 A1* | 4/2014 | Taniguchi | H01L 24/32 |
| | | | 361/771 |
| 2019/0078227 A1* | 3/2019 | Joshi | C25D 7/12 |

* cited by examiner

METHODS OF FORMING ELECTRONIC ASSEMBLIES WITH INVERSE OPAL STRUCTURES USING VARIABLE CURRENT DENSITY ELECTROPLATING

BACKGROUND

Field

The present specification generally relates to electronics assemblies, and more particularly, to methods of forming solid metal layers along an inverse opal structure by utilizing a variable current density during an electroplating process.

Technical Background

As electronics assemblies are designed to operate at increased power levels, thereby generating more heat due to the demands of electrical systems, conventional heat sinks are unable to adequately remove sufficient heat to effectively lower the operating temperature of the power electronics devices to acceptable temperature levels. Further, conventional heat sinks and cooling structures require additional bonding layers and thermal matching materials (e.g., bond layers, substrates, thermal interface materials). These additional layers add substantial thermal resistance to the overall assembly and make thermal management of the electronics system challenging.

Metal inverse opal (MIO) structures provide a thermal management of the assembly due to a general porosity of the structure, which enables enhanced nucleation sites for receiving a cooling fluid therein. MIO structures also provide a compact, bond layer that compensates for thermally-induced stress. However, due to the multiple pores (i.e., voids) present within the MIO structure, bonding the components of the power electronics assembly to the MIO structure may be challenging. Accordingly, a need exists to form a smooth surface along the MIO structure to facilitate bonding components of the power electronics assembly to the MIO structure.

SUMMARY

In one embodiment, a method of forming an inverse opal structure along a metal substrate including depositing a plurality of polymer spheres along the metal substrate, and electroplating the metal substrate and the plurality of polymer spheres at a first current density to form a first solid metal layer between the metal substrate and the plurality of polymer spheres such that the plurality of polymer spheres is raised from the metal substrate. The method includes electroplating the metal substrate and the plurality of polymer spheres at a second current density to diffuse metal from the metal substrate and deposit the metal about the plurality of polymer spheres. The second current density is greater than the first current density. The method includes electroplating the metal substrate and the plurality of polymer spheres to form a second solid metal layer disposed over the plurality of polymer spheres, and removing the plurality of polymer spheres to form the inverse opal structure disposed between the first solid metal layer and the second solid metal layer and having a porous structure. The first solid metal layer and the second solid metal layer define planar interface surfaces disposed over the porous structure of the inverse opal structure.

In another embodiment, a method for bonding a semiconductor device to a metal substrate, the method includes receiving a plurality of polymer spheres along the metal substrate, and electroplating the metal substrate at a low current density to form a first solid metal layer between the plurality of polymer spheres and the metal substrate such that the plurality of polymer spheres are lifted off the metal substrate. The method includes electroplating the metal substrate at a high current density to diffuse metal from the metal substrate and onto the plurality of polymer spheres such that an interconnected network of pores are formed over the first solid metal layer, and electroplating the metal substrate to form a second solid metal layer over the plurality of polymer spheres such that the plurality of polymer spheres are disposed between the first solid metal layer and the second solid metal layer. The method includes removing the plurality of polymer spheres to expose an inverse opal structure disposed within the interconnected network of pores such that the inverse opal structure is positioned between the first solid metal layer and the second solid metal layer. The first solid metal layer and the second solid metal layer form planar interface surfaces about the inverse opal structure. The method includes depositing the semiconductor device onto the second solid metal layer.

In yet another embodiment, a method of forming a power electronic assembly, the method includes positioning a plurality of polymer spheres against a metal substrate, and electroplating the metal substrate at a low current density to diffuse metal therefrom. The metal is deposited underneath the plurality of polymer spheres thereby forming a first solid metal layer on the metal substrate such that the plurality of polymer spheres are lifted relative to the metal substrate. The method includes electroplating the metal substrate at a high current density to diffuse metal therefrom. The metal is deposited about the plurality of polymer spheres thereby enclosing the plurality of polymer spheres therein. The method includes electroplating the metal substrate at the low or high current density to diffuse metal therefrom. The metal is deposited over the plurality of polymer spheres thereby forming a second solid metal layer on the plurality of polymer spheres such that the plurality of polymer spheres are disposed between the first solid metal layer and the second solid metal layer. The method includes removing the plurality of polymer spheres to form an inverse opal structure disposed therein and positioned between the first solid metal layer and the second solid metal layer, and placing a semiconductor device onto a smooth planar interface surface of the second solid metal layer.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, wherein like structure is indicated with like reference numerals and in which:

DETAILED DESCRIPTION

Figure 1:
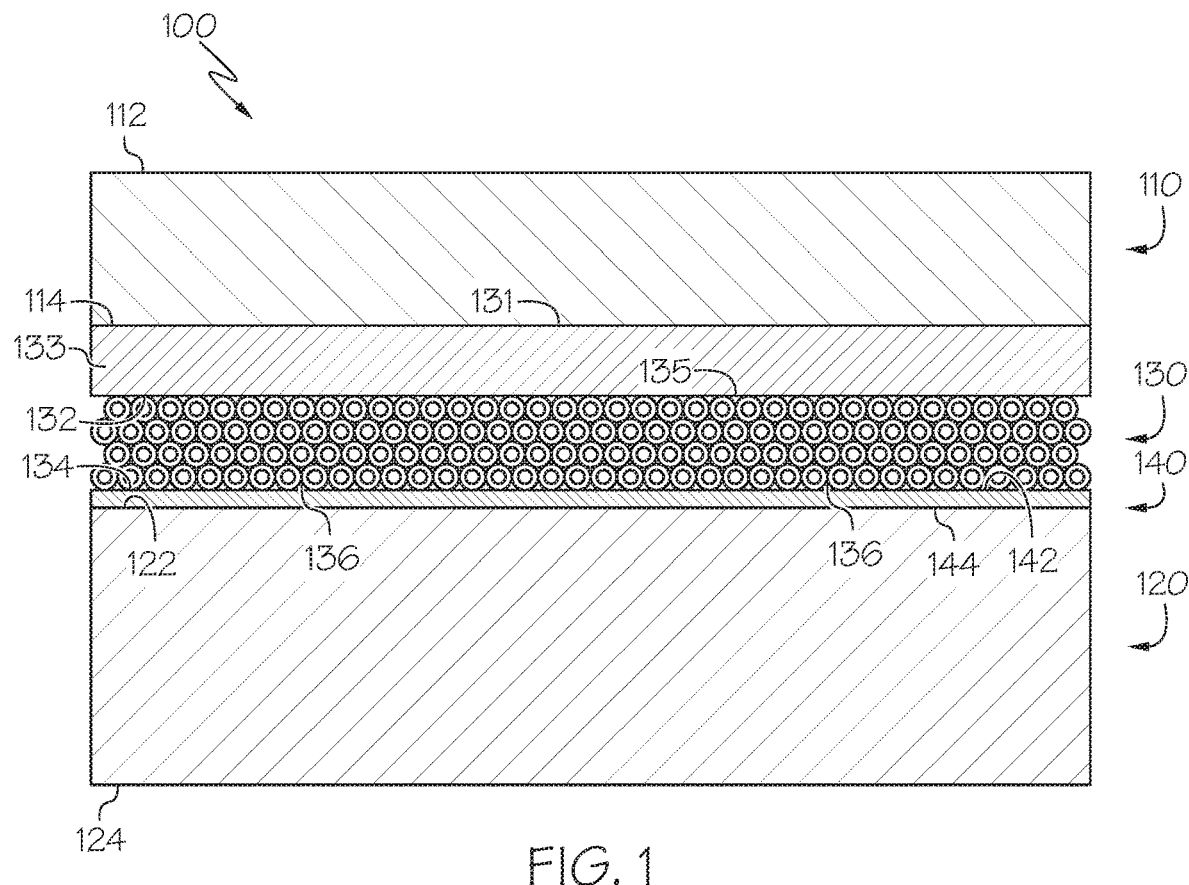
FIG. 1 schematically depicts an illustrative cross-sectional side view of an assembly having a device substrate thermally bonded to a metal substrate via a MIO bonding structure including a cap layer and according to one or more embodiments shown and described herein.

Electronics assemblies are often utilized in high-power electrical applications, such as inverter systems for hybrid electric vehicles and electric vehicles. Such power electronics assemblies include power semiconductor devices such as power insulated-gate bipolar transistors (IGBTs) and power transistors thermally bonded to a metal substrate. In embodiments, components of power electronic assemblies, such as a metal inverse opal structure formed along a metal substrate, may include a pair of solid metal layers formed thereon during an electroplating process of the power electronic assembly to provide a smooth interface layer for securing the inverse opal structure to other components of the power electronic assembly (e.g., the metal substrate, the power electronic semiconductor device, etc.). Providing smooth interface layers disposed on the inverse opal structure may enhance a bonding of the semiconductor device and/or the metal substrate of the power electronic assembly thereto relative to directly bonding said components to a porous surface of the inverse opal structure.

It should be understood that the substrates (e.g., power semiconductor devices) and assemblies (e.g., power electronics assemblies) described herein may be incorporated into an inverter circuit or system that converts direct current electrical power into alternating current electrical power and vice versa depending on the particular application. For example, in a hybrid electric vehicle application (not shown), several power electronics assemblies may be electrically coupled together to form a drive circuit that converts direct current electrical power provided by a bank of batteries into alternating electrical power that is used to drive an electric motor coupled to the wheels of a vehicle to propel the vehicle using electric power. The power electronics assemblies used in the drive circuit may also be used to convert alternating current electrical power resulting from use of the electric motor and regenerative braking back into direct current electrical power for storage in the bank of batteries.

Power semiconductor devices may generate a significant amount of heat during operation, which require bonds between the semiconductor device and the metal substrate that can withstand higher temperatures and thermally-induced stresses due to coefficient of thermal expansion (CTE) mismatch. The metal inverse opal (MIO) bonding structures described and illustrated herein may compensate for the thermally-induced stresses generated during thermal bonding of the semiconductor devices to the metal substrate by manageably controlling the thermal expansion and/or stiffness experienced by the layers of the metal substrate and semiconductor devices while also providing a compact package design. The MIO bonding structure may also provide an electrically conductive path between the semiconductor device and the substrate, and in some embodiments, a pair of electrodes disposed along the semiconductor device and the substrate. The MIO bonding structure may further provide a cooling layer for cooling the semiconductor devices during operation of the power electronics devices.

The present disclosure relates generally to a method for forming the power electronic assemblies described above including a power semiconductor device bonded to a metal substrate with a MIO bonding structure disposed therebetween. One or more of the devices of the power electronic assembly, such as, for example, the MIO bonding structure, may be formed with a pair of solid metal layers during an electroplating process when forming the power electronic assembly. The pair of solid metal layers may generate a smooth interface layer along an exterior surface of the MIO bonding structure that is sized and shaped to receive assembly components (e.g., the metal substrate, the power semiconductor device, etc.) thereon. One non-limiting example of a method for forming an assembly (e.g., a power electronics assembly) includes positioning a plurality of polymer spheres against a metal substrate along a top surface thereof and growing a first solid metal layer, an inverse opal structure, and a second solid metal layer along and/or over the plurality of polymer spheres by electroplating the assembly at variable current level densities.

Particularly, applying an electrical current at a low current density (e.g., ranging from about 50 milliampere per square centimeter ($mA/cm^2$) or less) through the metal substrate to electroplate the top surface with the plurality of polymer spheres positioned thereon may cause a diffusion of the metal substrate. In response to the application of the low current density, the plurality of polymer spheres are raised relative to the top surface of the metal substrate. In particular, metal diffused from the top surface of the metal substrate are deposited along a bottom surface of the plurality of polymer spheres positioned against the top surface thereby lifting the plurality of polymer spheres off of the top surface of the metal substrate. A solid metal layer is formed between the plurality of polymer spheres and the top surface of the metal substrate that is composed of the metal diffused from the substrate and deposited underneath the polymer spheres.

Applying a high electrical current (e.g., ranging from about 100 milliampere per square centimeter ($mA/cm^2$) or greater), relative to the low electrical current, through the metal substrate further electroplates the top surface with the plurality of polymer spheres positioned thereon. In this instance, continued electrodeposition of the metal substrate at the high current density may cause further diffusion of the metal substrate. The metal diffused from the metal substrate extends about the plurality of polymer spheres such that the deposited metal encloses the plurality of polymer spheres therein. In particular, metal diffused from the top surface of the metal substrate are fully deposited over an exterior body of the plurality of polymer spheres positioned against the top surface.

Additionally, electroplating the top surface with the MIO bonding structure fully formed over the plurality of polymer spheres may further cause formation of a solid metal cap layer extending above the plurality of polymer spheres. In particular, continued diffusion of metal ions from the top surface of the metal substrate, after electroplating at the low current density to diffuse metal in the voids between polymer spheres, are deposited along the top surface of the plurality of polymer spheres to form a smooth interface layer thereon (i.e. the solid metal cap layer). Removing the plurality of polymer spheres with a solution exposes the plurality of pores and/or voids of a MIO bonding structure disposed along the top surface of the metal substrate.

With the pair of solid metal layers positioned about the MIO bonding structure, a smooth interface layer is formed on opposing sides of the MIO structure that are sized and shaped to securely adhere components of the assembly thereto. In particular, the solid metal layer formed between the metal substrate and the MIO bonding structure provides a smooth continuous surface therebetween, and the solid metal cap layer formed between the power semiconductor device and the MIO bonding structure provides an additional smooth continuous surface therebetween, both of which are configured to enhance an attachment of the MIO bonding structure to the power semiconductor device and the metal substrate. Various embodiments of power electronic assemblies including the pair of solid metal layers and methods for forming said layers along the MIO bonding structure will be described in greater detail herein.

Referring initially to FIG. 1, a non-limiting example of an assembly 100, such as, for example, a power electronics assembly, is illustrated. The example assembly 100 generally includes a semiconductor device 110 with a first surface 112 and a second surface 114, an inverse opal bonding structure 130 (e.g., metal inverse opal (MIO) bonding structure) with a first major surface 132 and a second major surface 134, and a substrate 120 with a first surface 122 and a second surface 124. The assembly 100 further includes one or more solid metal layers disposed therein. In the embodiment, the assembly 100 includes a solid metal cap layer 133 (i.e. a first solid metal layer) and a solid metal base layer 140 (i.e. a second solid metal layer). In particular, the MIO bonding structure 130 is disposed between the solid metal cap layer 133, which is formed along and bonded to the first major surface 132, and the solid metal base layer 140 formed along and bonded to the second major surface 134.

The second surface 114 of the semiconductor device 110 is bonded to the MIO bonding structure 130 via the solid metal cap layer 133, and the first surface 122 of the substrate 120 is bonded to the MIO bonding structure via the solid metal base layer 140. In the embodiment, the solid metal base layer 140 is relatively thinner than the solid metal cap layer 133. As will be described in greater detail herein, the MIO bonding structure 130, the solid metal cap layer 133 and the solid metal base layer 140 may be formed and bonded to one another, the semiconductor device 110, and the substrate 120 by electroplating the substrate 120 at a variable current density as a plurality of polymer spheres 150 are positioned against the substrate 120.

Still referring to FIG. 1, the semiconductor device 110 may generally be any electronic device that uses semiconductor materials. In some embodiments, the semiconductor device 110 may be formed from a wide band gap semiconductor material suitable for the manufacture or production of power semiconductor devices, such as, for example, a power insulated-gate bi-polar transistor (IGBTs), a power metal-oxide field-effect transistor (MOSFET), a power transistor, and the like. In some embodiments, the semiconductor device 110 may be formed from wide band gap semiconductor materials. Non-limiting examples of such wide band gap semiconductor materials include silicon carbide (SiC), aluminum nitride (AlN), gallium nitride (GaN), gallium oxide ($Ga_2O_3$), boron nitride (BN), diamond, and/or the like.

Still referring to FIG. 1, the thickness of the semiconductor device 110 may depend on the intended use of the assembly 100. In non-limiting examples, the semiconductor device 110 has a thickness of about 0.1 millimeters to about 0.3 millimeters. It should be understood that other thicknesses of the semiconductor device 110 may be utilized in assembly 100 without departing from the scope of the present disclosure. The MIO bonding structure 130 may generally be any inverse opal structure, such as, for example, a copper inverse opal (CIO) structure, a nickel inverse opal (NIO) structure, and/or the like. The MIO bonding structure 130 has a plurality of pores 136 that define a porosity of the MIO bonding structure 130. The plurality of pores 136 may facilitate a thermal conductivity for the MIO bonding structure 130 between the semiconductor device 110 and the solid metal base layer 140.

In some embodiments, the solid metal base layer 140 is configured to serve as a heat spreader disposed between the first surface 122 of the substrate 120 and the second major surface 134 of the MIO bonding structure 130. In other words, the solid metal base layer 140 disperses heat along the interface between the MIO bonding structure 130 and the substrate 120 to thereby inhibit a formation of hot spots therebetween during operation of the assembly 100. Additionally, the solid metal base layer 140 is further configured to provide lower electrical resistance for electrical current that flows through the assembly 100. In some embodiments, the assembly 100 may be coupled to a cooling apparatus such that the pores 136 of the MIO bonding structure 130 are configured to facilitate thermal conductivity between the semiconductor device 110 and the cooling device. In particular, the plurality of pores 136 define depressions or voids such that fluid introduced into the assembly 100 can flow through each of the plurality of networked pores 136 throughout the MIO bonding structure 130 and contact a greater amount of surface area for the purposes of heat transfer. Such fluid may include a cooling fluid received through the plurality of pores 136 and transferred through the MIO bonding structure 130 to transfer heat generated by the semiconductor device 110 while in use and cool the assembly 100. In other words, as fluid flows through the plurality of pores 136 and/or other surface features of the MIO bonding structure 130, latent heat of the assembly 100 is absorbed by the fluid due to the relative cooler temperature of the fluid.

Additionally, with the heat effectively absorbed by the fluid received through the porous structure of the MIO bonding structure 130, the heat is transferred through the MIO bonding structure 130 with the movement of the fluid to other portions of the assembly 100 (i.e. the substrate 120) to draw the heat away from the one or more heat generating devices (i.e., the semiconductor device 110). In some embodiments, heat can be transferred to the fluid from the MIO bonding structure 130 such that the fluid carries the heat away from the semiconductor device 110 and is received along the solid metal base layer 140. The solid metal base layer 140 spreads the heat received from the semiconductor device 110 via the MIO bonding structure 130 thereby inhibit hot spots from forming within the assembly 100. Transferring heat generated by the semiconductor device 110 via fluid that is received through the MIO bonding structure 130 is optimal for cooling the assembly 100 during use. While the MIO bonding structure 130 of the present example is specifically shown and described herein as defining a series of pores 136 throughout the MIO bonding structure 130, other surface features contained within the MIO bonding structure 130 may also be included without departing from the scope of the present disclosure.

Still referring to FIG. 1, the number of pores 136 and/or other surface features present in the MIO bonding structure 130 is not limited by the present disclosure, and may be any number so long as the connectivity between the material of the MIO bonding structure 130 and the solid metal base layer 140 and the second surface 114 of the semiconductor device 110 is maintained. While the plurality of pores 136 is depicted as being generally spherical in shape, this is merely illustrative. Accordingly, it should be understood that the plurality of pores 136 may be any shape, including, for example, spherical, cylindrical, and/or irregular shapes. The shape of the pores 136 may be determined from the shape of the materials used to form the MIO bonding structure 130 (i.e., the type of metal). Further, the thickness of the MIO bonding structure 130 is not limited by the present disclosure, and may generally be any thickness.

The solid metal cap layer 133 of the assembly 100 includes a thickness extending between a top interface surface 131 and a bottom interface surface 135. The solid metal base layer 140 of the assembly 100 includes a thickness extending between a top interface surface 142 and a bottom interface surface 144. As briefly described above, in the embodiment the solid metal base layer 140 includes a thinner thickness and/or width extending between the interfaces surfaces 142, 144 relative to the solid metal cap layer 133 extending between the interface surfaces 131, 135. However, it should be understood that in other embodiments the solid metal cap layer 133 and/or the solid metal base layer 140 may include various other thicknesses than those shown and described herein without departing from the scope of the present disclosure.

Still referring to FIG. 1, the pair of solid metal layers 133, 140 are integrally formed with the plurality of pores 136 of the MIO bonding structure 130. In particular, the first major surface 132 of the MIO bonding structure 130 is securely adhered to the bottom interface surface 135 of the solid metal cap layer 133 and the second major surface 134 of the MIO bonding structure 130 is securely adhered to the top interface surface 142 of the solid metal base layer 140. In this instance, the pair of solid metal layers 133, 140 form a unitary structure with the MIO bonding structure 130 such that the pair of solid metal layers 133, 140 are formed of a material substantially similar to the MIO bonding structure 130. In some embodiments, one or more of the pair of solid metal layers 133, 140 may be formed of a material different than a material composition of the substrate 120, the MIO bonding structure 130, and/or the other corresponding solid metal layer 133, 140.

The interface surfaces 131, 135 of the solid metal cap layer 133 define a continuously planar interface between the first major surface 132 of the MIO bonding structure 130 and the second surface 114 of the semiconductor device 110. The interface surfaces 142, 144 of the solid metal base layer 140 define a continuously planar interface between the second major surface 134 of the MIO bonding structure 130 and the first surface 122 of the substrate 120. As described in greater detail herein, the interface surfaces 131, 135 of the solid metal cap layer 133 and the interface surfaces 142, 144 of the solid metal base layer 140 are cooperatively configured to securely bond the semiconductor device 110 and the substrate 120 to the MIO bonding structure 130, and in particular to the porous configuration of the MIO bonding structure 130.

As briefly described above, the MIO bonding structure 130, the solid metal cap layer 133, and the solid metal base layer 140 may generally be constructed of a thermally conductive material, but is otherwise not limited by the present disclosure. In some embodiments, the material used for the MIO bonding structure 130, the solid metal cap layer 133, and the solid metal base layer 140 may be selected based on the process used to form the MIO bonding structure 130, the solid metal cap layer 133, and the solid metal base layer 140 as described in greater detail herein. For example, if the MIO bonding structure 130, the solid metal cap layer 133 and the solid metal base layer 140 are formed from an MIO formation process, metals that are suitable for such a formation process may be used. Illustrative examples of materials that may be used include, but are not limited to, aluminum, nickel, copper, silver, gold, an alloy containing any of the foregoing, a compound containing any of the foregoing, and the like. Other materials that are generally understood to result from an inverse opal formation process that are not specifically disclosed herein are also included within the scope of the present disclosure.

Still referring to FIG. 1, it should be understood that inverse opal structures (including MIO structures) have a high permeability, as inverse opal wick structures provide the advantage of improved control over pore sizes and distribution. Accordingly, the thermal conductivity of the MIO bonding structure 130, the solid metal cap layer 133, and the solid metal base layer 140 can be varied and controlled to accommodate thermomechanical stresses generated within the assembly 100. In some embodiments, the MIO bonding structure 130 is further configured to provide heat flux thermal management within the assembly 100 such that the MIO bonding structure 130 may improve heat exchange between the semiconductor device 110 and the substrate 120 at a high heat removal rate. It should be understood that in other embodiments, the assembly 100 may include other arrangements and/or configurations than that shown and described above, as described herein below.

It should be understood that a thickness of the pair of solid metal layers 133, 140 are not limited by the present disclosure, and may generally be any thickness. For instance, a thickness of the pair of solid metal layers 133, 140 extending between the top interface surfaces 131, 142 and the bottom interface surface 135, 144, respectively, may depend on a density of electrical current applied to the substrate 120 to electroplate the first surface 122 with the plurality of polymer spheres 150 positioned thereon. Additionally and/or alternatively, a thickness of the solid metal layers 133, 140 may depend on a size, shape and/or thickness of the plurality of polymer spheres 150 positioned against the first surface 122 of the substrate 120. A lateral width of the pair of solid metal layers 133, 140 may depend on density of electrical current applied to the substrate 120 and/or a lateral width of the plurality of polymer spheres 150 disposed along the substrate 120.

Figure 2A:
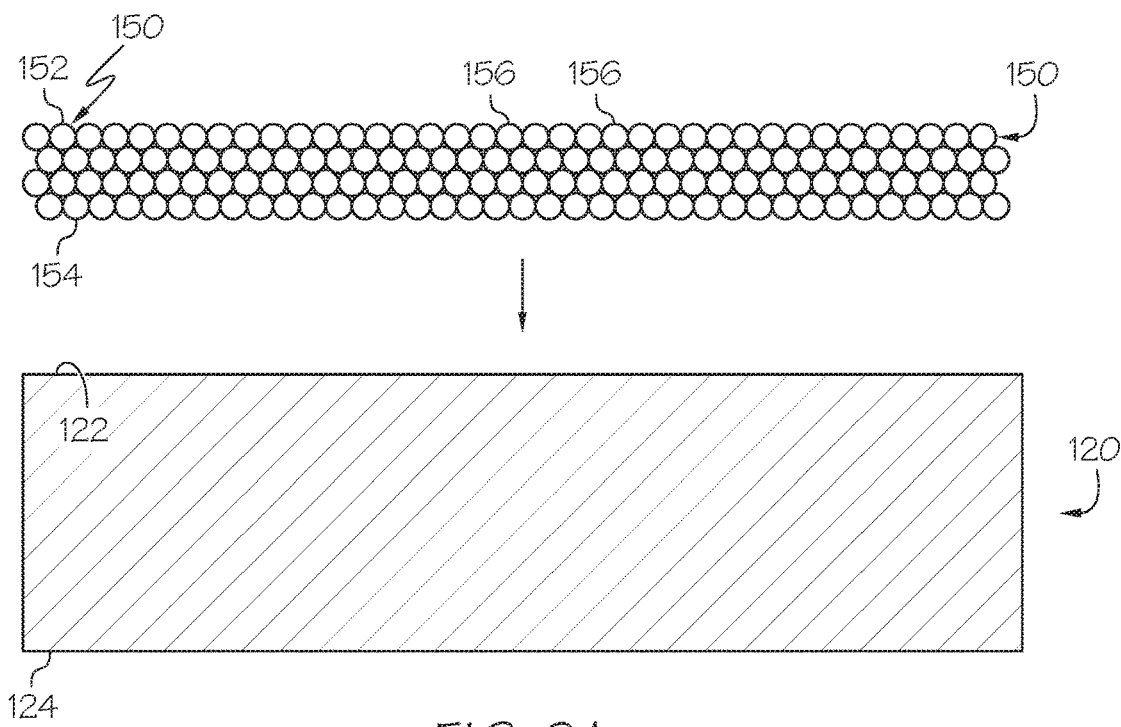
FIG. 2A schematically depicts a method of fabricating the assembly of FIG. 1 by positioning a plurality of polymer spheres against the metal substrate according to one or more embodiments shown and described herein.
Figure 2B:
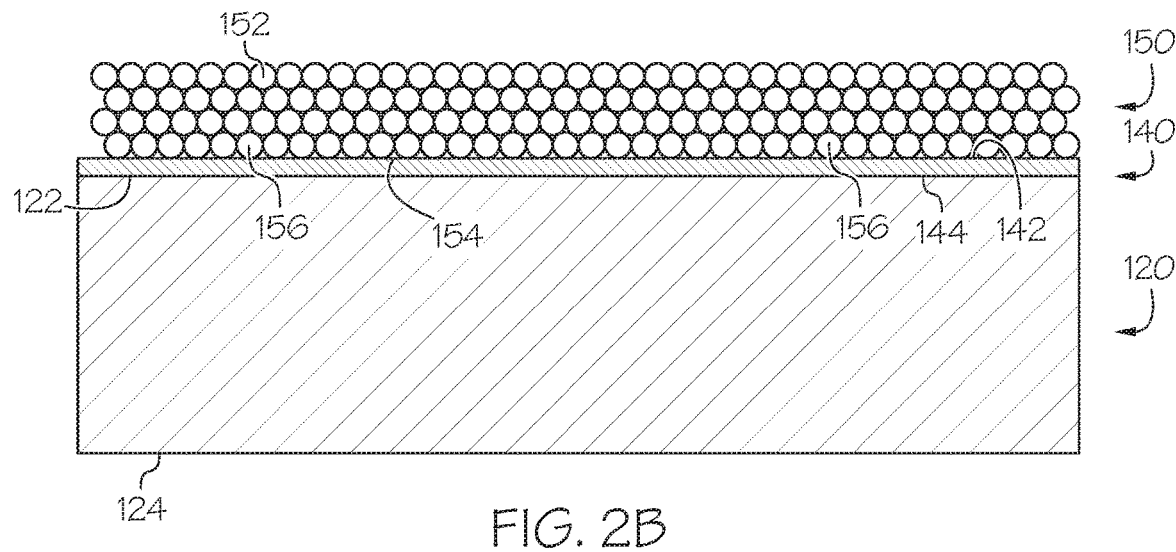
FIG. 2B schematically depicts a method of fabricating the assembly of FIG. 1 by electroplating the metal substrate at a low current density to raise the plurality of polymer spheres from the metal substrate and form a first solid metal layer therebetween according to one or more embodiments shown and described herein.
Figure 2C:
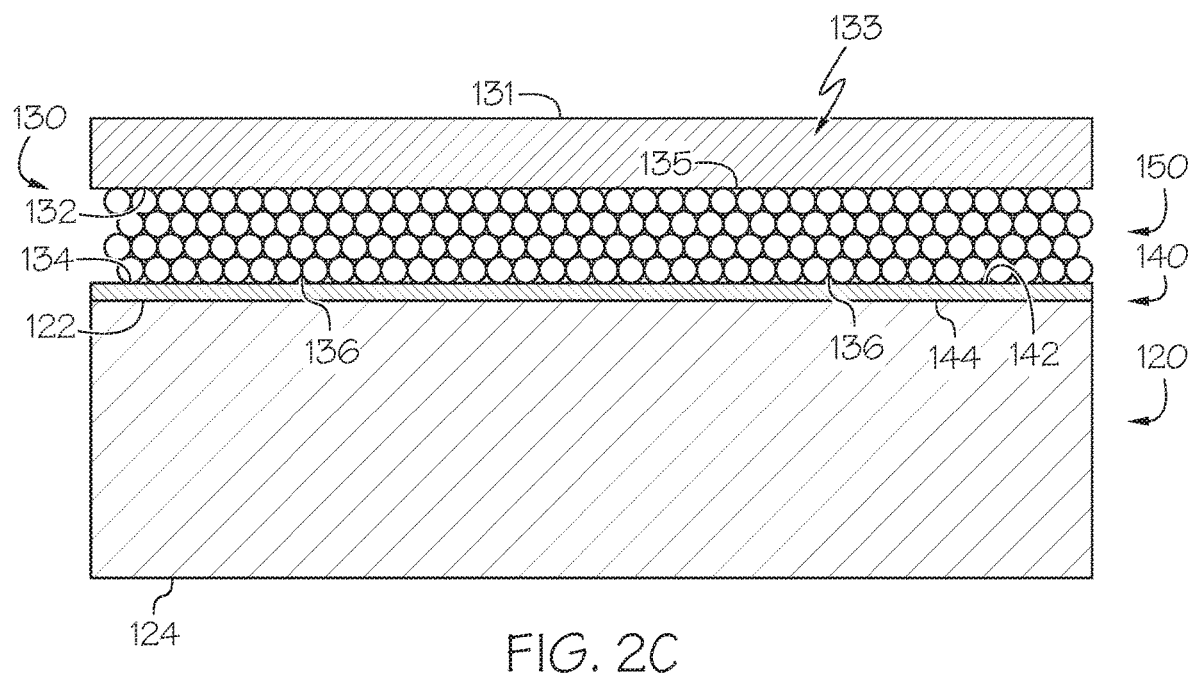
FIG. 2C schematically depicts a method of fabricating the assembly of FIG. 1 by electroplating the metal substrate at a high current density to form an inverse opal structure about the plurality of polymer sphere and a second solid metal layer over the plurality of polymer spheres according to one or more embodiments shown and described herein.
Figure 2D:
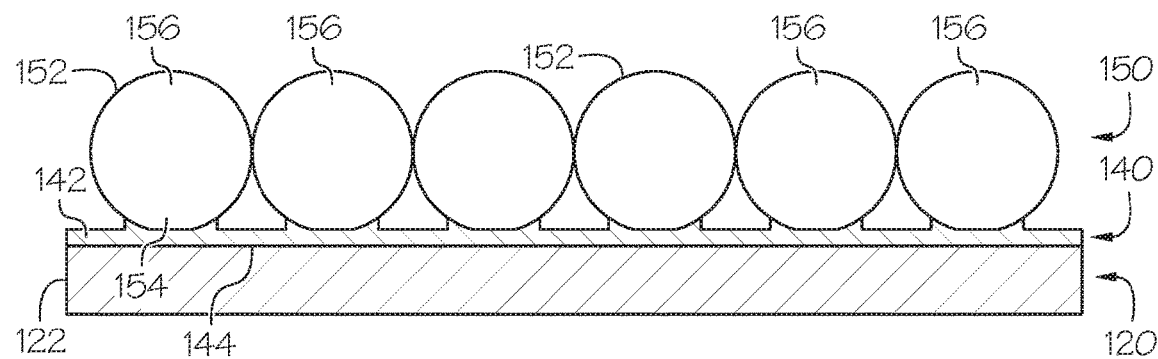
FIG. 2D schematically depicts an illustrative side view of the assembly of FIG. 1 with the plurality of polymer spheres raised from the metal substrate and a first solid metal layer formed therein while electroplating the metal substrate at a low current density according to one or more embodiments shown and described herein.
Figure 2E:
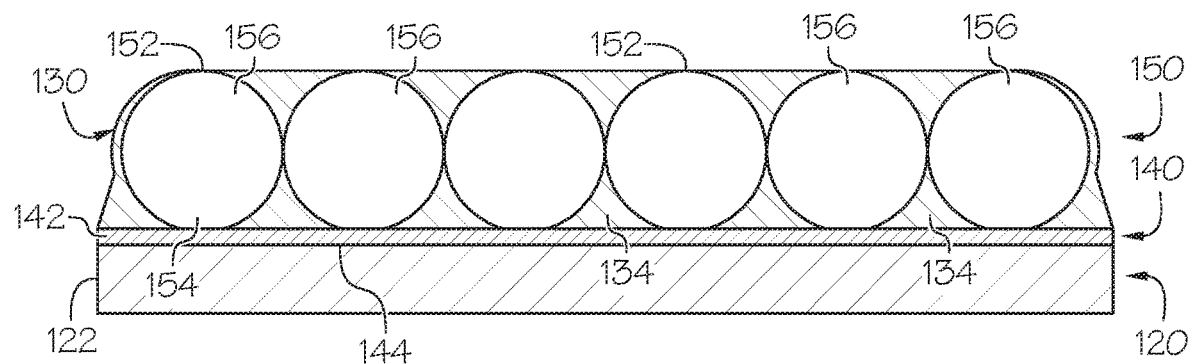
FIG. 2E schematically depicts an illustrative side view of the assembly of FIG. 1 with a first solid metal layer formed beneath the plurality of polymer spheres and an inverse opal structure formed around the plurality of polymer spheres while electroplating the metal substrate at a high current density according to one or more embodiments shown and described herein.
Figure 2F:
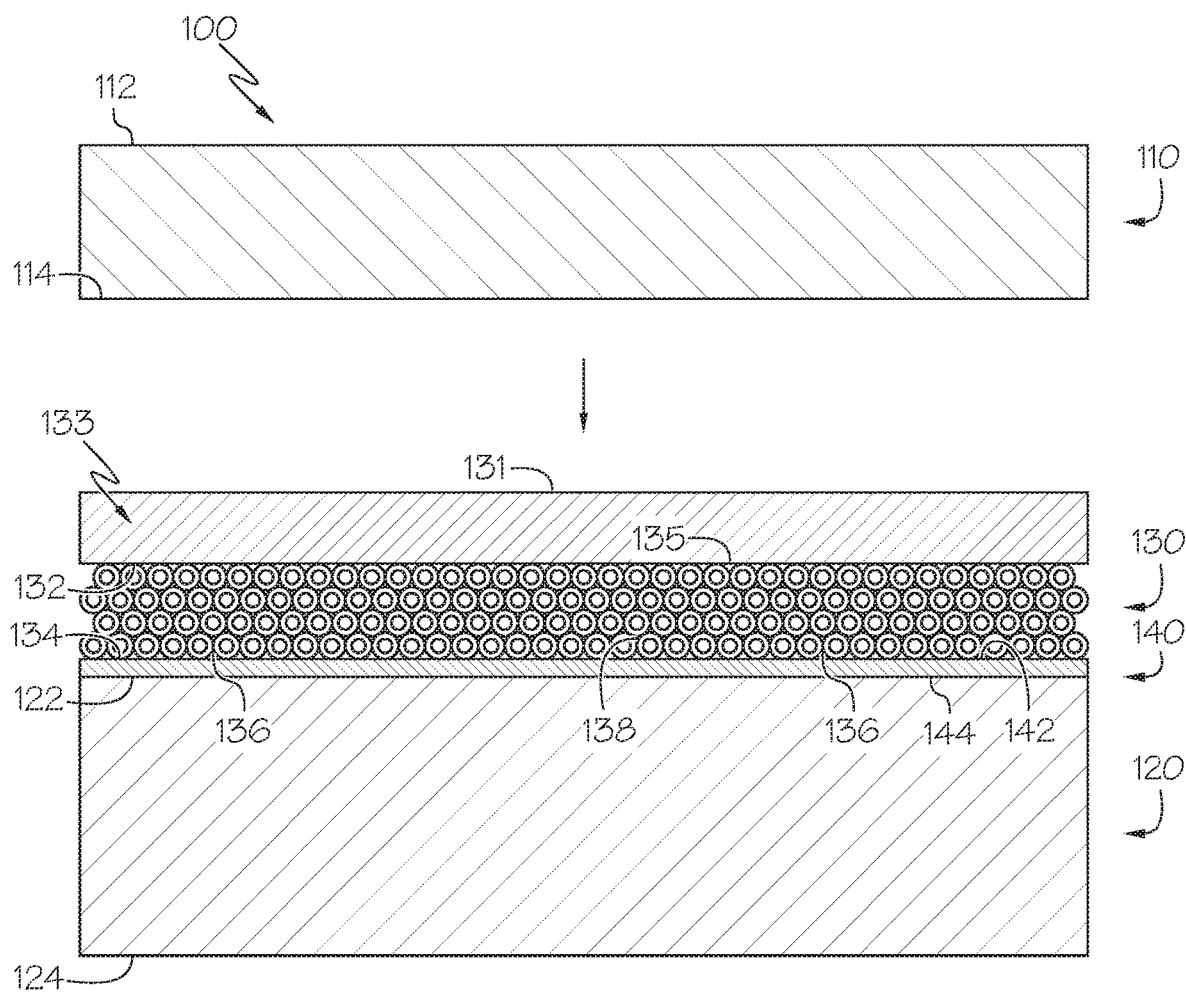
FIG. 2F schematically depicts a method of fabricating the assembly of FIG. 1 by dissolving the plurality of polymer spheres and positioning a device substrate against a second solid metal layer according to one or more embodiments shown and described herein.
Figure 3:
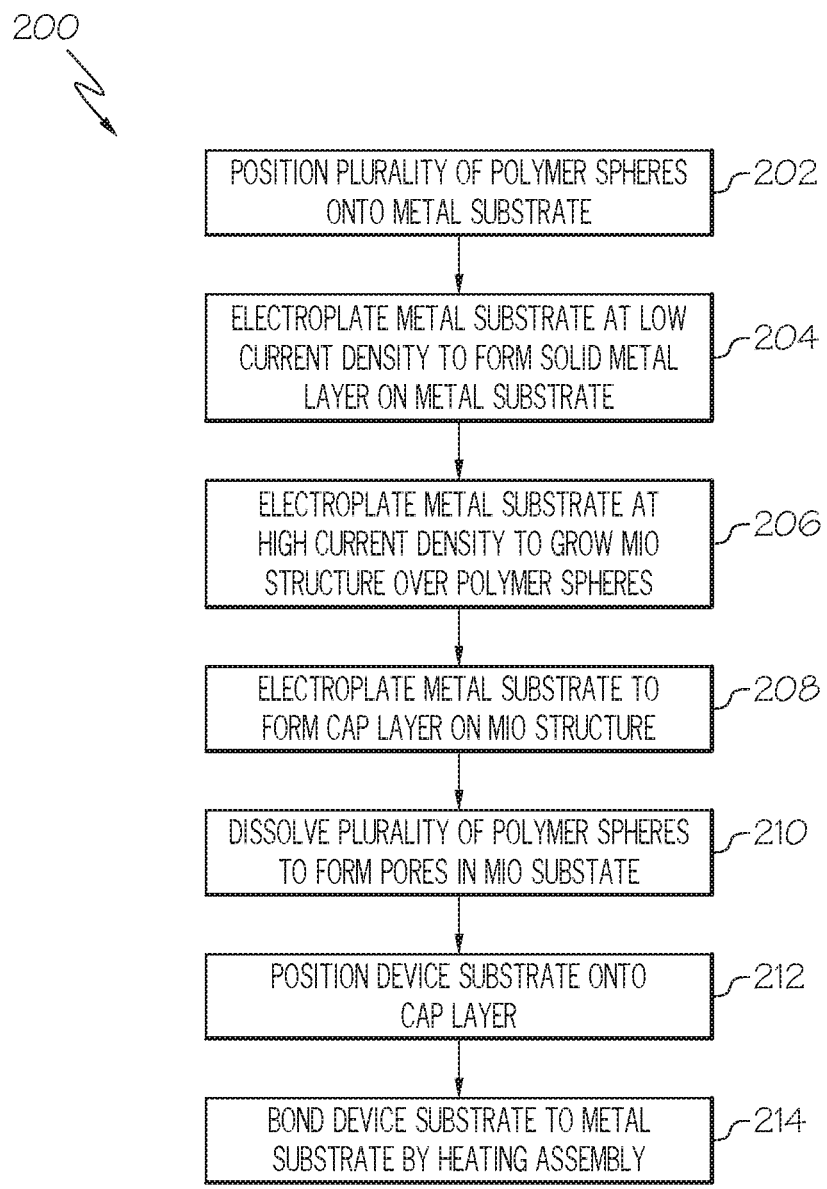
FIG. 3 depicts a flow diagram of an illustrative method of forming the assembly of FIG. 1 according to one or more embodiments shown and described herein.

Referring now to FIGS. 2A-2G and the flow chart of FIG. 3, an example method 200 for forming the assembly 100, and more particularly the MIO bonding structure 130 with the pair of solid metal layers 133, 140 generally described above is shown. It should be understood that method 200 is merely illustrative and that the assembly 100 may be formed via other methods. At block 202, and as depicted in FIG. 2A, the plurality of polymer spheres 150 are positioned against the substrate 120, and in particular a bottom surface 154 of each of the plurality of polymer spheres 150 is received along a first surface 122 of the substrate 120. In this instance, the plurality of polymer spheres 150 and the substrate 120 are not bonded together by an intermediary bonding layer disposed therebetween. However, it should be understood that in other embodiments the substrate 120 and the plurality of polymer spheres 150 may be bonded together with an intermetallic compound layer formed therebetween.

The plurality of polymer spheres 150 includes a body 156 disposed between a top surface 152 and the bottom surface 154. In some embodiments, the body 156 of each of the plurality of polymer spheres 150 are formed of polystyrene (PS) and may comprise various shapes, sizes, and/or configurations. For example, in some embodiments the body 156 of the plurality of polymer spheres 150 are sized approximately 5 microns or less, however, it should be understood that the body 156 may include various other sizes without departing from the scope of the present disclosure. As briefly described above, it should be understood that additional and/or fewer layers of the plurality of polymer spheres 150 may be included in the assembly 100 than those shown and described herein without departing from a scope of the present disclosure.

At block 204, and as depicted in FIG. 2B, the first surface 122 of the substrate 120 is electroplated with the plurality of polymer spheres 150 positioned thereon. In particular, an electrical current is passed through the assembly 100 at a relatively low current density ranging from about 50 milliampere per square centimeter ($mA/cm^2$) or less. In this instance, by applying a low current density to the first surface 122 of the substrate 120 during the electroplating process, metal (e.g., copper) from the substrate 120 are diffused from the first surface 122. With the bottom surface 154 of the plurality of polymer spheres 150 disposed along the first surface 122 of the substrate 120 during the electroplating process, the diffused copper are deposited along the bottom surfaces 154 of each of the plurality of polymer spheres 150.

More specifically, the copper diffused from the first surface 122 of the substrate 120 extend outwardly therefrom toward the bottom surface 154 of the plurality of spheres 150, thereby lifting the plurality of polymer spheres 150 from the first surface 122. In this instance, as the diffused metal raise the plurality of polymer spheres 150 from the first surface 122 of the substrate 120 the first surface 122 is simultaneously deposited on a body 156 of each of the plurality of polymer spheres 150 along the bottom surface 154. An extent and/or offset distance in which the body 156 of each of the plurality of polymer spheres 150 is lifted from the first surface 122 of the substrate 120 may be dependent on various features, including a density of electrical current applied to the substrate 120 during the electroplating at block 204, a duration of applying the electrical current to the substrate 120 during the electroplating at block 204, and/or the like.

Referring specifically to FIG. 2D, the solid metal base layer 140 is gradually formed along the first surface 122 of the substrate 120 as the metal from the substrate 120 are diffused therefrom. The diffused metal cause formation of the solid metal base layer 140 between the first surface 122 of the substrate 120 and the bottom surface 154 of the plurality of polymer spheres 150, thereby causing the top interface surface 142 of the solid metal base layer 140 to extend outwardly from the substrate 120. The top interface surface 142 extends onto an exterior of the body 156 of each of the plurality of polymer spheres 150 along the bottom surface 154, thereby raising the plurality of polymer spheres 150 as a thickness of the solid metal base layer 140 gradually increases with continued the electrodeposition at the low current electrical density.

With the current density maintained at a relatively low level, and the electroplating process maintained at a predetermined, and relatively short duration (e.g., ten minutes), only the first surface 122 of the substrate 120 is effectively electroplated with the solid metal base layer 140 is are formed thereon. It should be understood that with the current density maintained at a relatively low level during the electroplating of the substrate 120 at block 204, the diffused metal are not received within a void(s) and/or space(s) disposed between the bodies 156 of adjacent polymer spheres 150. It should further be understood that the low current density applied at block 204 is such that the deposited metal is deposited on the plurality of polymer spheres 150 and removably adhered to the substrate 120. The inclusion of the plurality of polymer spheres 150 along the first surface 122 inhibits a material of the substrate 120 (e.g., copper) from being smoothly electroplated over the plurality of polymer spheres 150 as the copper diffused therefrom are effectively deposited underneath and/or along the body 156 of the plurality of polymer spheres 150, thereby forming the solid metal base layer 140.

It should be understood that in response to maintaining a low current density during the electroplating process of the substrate 120, the metal diffused from the first surface 122 are capable of forming a controlled size and/or shape of the solid metal base layer 140 thereon in accordance with a physical configuration of the plurality of polymer spheres 150. Accordingly, as a portion of the cooper from the first surface 122 of the substrate 120 contacts the bottom surface 154 of the plurality of polymer spheres 150, copper is effectively diffused from the first surface 122 and bonded to the body 156 of the polymer spheres 150 such that the solid metal base layer 140 is defined by the electrodeposition of copper underneath the plurality of polymer spheres 150.

At block 206, and still referring to FIG. 2B, the first surface 122 of the substrate 120 is further electroplated by passing an electrical current through the assembly 100 at a relatively greater current density than the low current density at block 204. In particular, a high current density ranging from about 100 milliampere per square centimeter ($mA/cm^2$) to about 50 milliampere per square centimeter ($mA/cm^2$) is applied to the substrate 120. In this instance, by applying a high current density to the first surface 122 of the substrate 120 during the electroplating process, additional metal (e.g., copper) from the substrate 120 are diffused from the first surface 122 and/or the solid metal base layer 140 integrally formed thereon.

With the bottom surface 154 of the plurality of polymer spheres 150 maintained along the top interface surface 142 of the solid metal base layer 140 during the electroplating process at block 206, the diffused copper is deposited over the plurality of polymer spheres 150. More specifically, the copper diffused from the first surface 122 of the substrate 120 and/or the top interface surface 142 of the solid metal base layer 140 continue to extend outwardly therefrom toward the top surface 152 of the plurality of spheres 150. As the electrical current applied to the assembly 100 is at a relatively higher density at block 206 than at block 204, the copper diffused from the substrate 120 and/or the solid metal base layer 140 grow over the body 156 of each of the plurality of polymer spheres 150, rather than lifting the polymer spheres 150 as in block 204. In this instance, the diffused copper fills any voids disposed between the plurality of polymer spheres 150. Accordingly, the first major surface 132 of the MIO bonding structure 130 is gradually formed over the top surface 152 of the plurality of polymer spheres 150 and the second major surface 134 of the MIO bonding structure 130 is gradually formed below the bottom surface 154 of the plurality of polymer spheres 150.

Referring specifically to FIG. 2E, the MIO bonding structure 130 is formed along the top interface surface 142 of the solid metal base layer 140 that is disposed over the first surface 122 of the substrate 120. In particular, the MIO bonding structure 130 is formed about the plurality of polymer spheres 150 as the metal from the substrate 120 and/or the solid metal base layer 140 are diffused therefrom and extend outwardly over the body 156 of each of the plurality of polymer spheres 150. As noted herein, an extent and rate of growth of the MIO bonding structure 130 over the substrate 120 is dependent on a level of current density applied to the substrate 120 during the electroplating process, and a duration of the electroplating process at block 206. With the high current density applied at block 206 being relatively greater than the low current density applied at block 204, growth of the MIO bonding structure 130 is increased relative to the formation of the solid metal base layer 140. Accordingly, the high current density causes the diffused metal from the substrate 120 to grow rapidly around the plurality of polymer spheres 150. In this instance, the MIO bonding structure 130 is formed between the major surfaces 132, 134 and between the voids of the plurality of polymer spheres 150.

As described in detail above, with the inclusion of the plurality of polymer spheres 150 along the first surface 122 of the substrate and the top interface surface 142 of the solid metal base layer 140 formed thereon, a material of the substrate 120 and/or the solid metal base layer 140 (e.g., copper) is inhibited from being smoothly electroplated over the plurality of polymer spheres 150 as the copper is diffused therefrom. Accordingly, the MIO bonding structure 130 is effectively formed about and over the plurality of polymer spheres 150 located therein. It should be understood that in response to maintaining a high current density during the electroplating process of the substrate 120 at block 206, the diffused metal is capable of growing the MIO bonding structure 130 over the body 156 of the plurality of polymer spheres 150 in accordance with a physical configuration of the plurality of polymer spheres 150.

At block 208, and as depicted in FIG. 2C, the first surface 122 of the substrate 120 is further electroplated by passing an electrical current through the assembly 100. In particular, any current density may be applied to the substrate 120. In this instance, by applying a current density to the substrate 120 during the electroplating process at block 208, with the MIO bonding structure 130 formed over the plurality of polymer spheres 150, the metal (e.g., copper) diffused from the substrate 120 and/or the solid metal base layer 140 extend over the first major surface 132 of the MIO bonding structure 130. In particular, with the first major surface 132 of the MIO bonding structure 130 formed in substantial alignment with the top surface 152 of the plurality of polymer spheres 150, in response to electroplating the substrate 120 at block 206, further electrodeposition of the substrate 120 provides for continued diffusion of copper ions from the substrate 120. More specifically, the copper diffused from the first surface 122 of the substrate 120 and/or the top interface surface 142 of the solid metal base layer 140 extend outwardly from the top surface 152 of the plurality of polymer spheres 150 and the first major surface 132 of the MIO bonding structure 130. Accordingly, the solid metal cap layer 133 is.

The solid metal cap layer 133 is gradually formed along the first major surface 132 as the metal from the substrate 120 and/or solid metal base layer 140 are diffused and deposited along the top surface 152 of the plurality of polymer spheres 150. In response to the formation of the solid metal cap layer 133 thereon, a planar and/or continuously smooth surface is formed via the top interface surface 131 of the solid metal cap layer 133. An extent and rate of growth of the solid metal cap layer 133 is dependent on a level of current density applied to the substrate 120 during the electroplating process, and duration of the electroplating process, at block 208. In some embodiments, the current density applied at block 208 is maintained at a relatively low level to form the smooth interface at the top interface surface 131, while in other embodiments a high current density is applied during the electroplating process of block 208 to effectively form the solid metal cap layer 133 over the MIO bonding structure 130.

An absence of polymer spheres 150 beyond the top surface 152 and the first major surface 132 of the MIO bonding structure 130 allows a material of the substrate 120 and/or the solid metal base layer 140 (e.g., copper) to be smoothly electroplated over the plurality of polymer spheres 150 and the MIO bonding structure 130 as the copper diffused therefrom are effectively deposited over the plurality of polymer spheres 150. It should be understood that in response to maintaining a high current density during the electroplating process of the substrate 120 at block 208, the metal diffused from the first surface 122 is capable of forming the top interface surface 131 at a relatively increased rate than a low current density. It should further be understood that in some embodiments additional layers of the plurality of polymer spheres 150 may be secured to the substrate 120 prior to generating the MIO bonding structure 130, the solid metal cap layer 133, and/or the solid metal base layer 140 without departing from the scope of the present disclosure. In this instance, the plurality of polymer spheres 150 may be electroplated and/or electrolytically deposited onto the substrate 120 prior to applying an electrical current to the substrate 120, and the pair of solid metal layers 133, 140 may be similarly electroplated and/or electrolytically deposited onto plurality of polymer spheres 150.

Referring now to FIG. 2F and at block 210, the plurality of polymer spheres 150 are removed from the assembly 100 to expose the MIO bonding structure 130 formed therein. In particular, removal of the plurality of polymer spheres 150 reveals the plurality of pores 136 of the MIO bonding structure 130. It should be understood that the plurality of polymer spheres 150 may be removed from the assembly 100 via various methods, including, but not limited to, dissolving the plurality of polymer spheres 150 with a solution (e.g., a hydrofluoric acid solution) to thereby uncover the MIO bonding structure 130 disposed therein. Although in the present example the plurality of polymer spheres 150 are described as being removed prior to a deposition of the semiconductor device 110, it should be understood that in other embodiments the plurality of polymer spheres 150 may be removed from the assembly 100 after the semiconductor device 110 is deposited on the solid metal cap layer 133.

The plurality of polymer spheres 150 is generally constructed of a material that can later be dissolved, etched, or otherwise removed without altering the shape of the MIO bonding structure 130, the solid metal cap layer 133, the solid metal base layer 140, and/or other surface features formed thereon as described herein. In some embodiments, the plurality of polymer spheres 150 may be a self-assembled patterned structure. With the plurality of polymer spheres 150 removed, a patterned structure of the MIO bonding structure 130 is exposed. In other words, metal inverse opals are effectively formed on the substrate 120, and in particular, between the pair of solid metal layers 133, 140 where the plurality of polymer spheres 150 were disposed between.

Referring still to FIG. 2F and at block 212, the semiconductor device 110 may be placed onto the solid metal cap layer 133 disposed over the MIO bonding structure 130. For instance, the second surface 114 of the semiconductor device 110 may be deposited onto the solid metal cap layer 133, and more particularly along the top interface surface 131 of the solid metal cap layer 133. At block 214, the semiconductor device 110 may be bonded to the solid metal cap layer 133 via solder, thermal bonding, transient liquid phase (TLP) bonding, and/or the like. In particular, the semiconductor device 110 is bonded to the solid metal cap layer 133 along the interface extending between the second surface 114 of the semiconductor device 110 and the top interface surface 131 of the solid metal cap layer 133. It should be understood that TLP bonding may be particularly used in instances where the semiconductor device 110 is a wide bandgap semiconductor device that operates at relatively high temperatures (e.g., at a temperature of about 200° Celsius or greater than about 200° Celsius).

This is particularly due to the TLP bond layers being capable of adhering the components of the assembly 100 (i.e., the semiconductor device 110, the MIO bonding structure 130, etc.) at relatively high temperatures better than other layers, such as, for example, a solder layer. In some embodiments, upon bonding the semiconductor device 110 to the assembly 100, a cooling structure, such as, for example, a heat sink, may be bonded thereto via the solid metal cap layer 133, the MIO bonding structure 130, the solid metal base layer 140, and/or the substrate 120. In this instance, the heat sink may remove heat generated by the semiconductor device 110 to effectively lower an operating temperature of the assembly 100.

Still referring to FIG. 2F, with the solid metal cap layer 133 disposed over the first major surface 132 of the MIO bonding structure 130 and the solid metal base layer 140 disposed over the second major surface 134, and the pair of solid metal layers 133, 140 each including smooth interfaces along the interface surfaces 131, 135, 142, 144, respectively, a bond between the semiconductor device 110 and the substrate 120 with the MIO bonding structure 130 disposed therebetween is increased due to the smooth and/or planar surface characteristics of the pair of solid metal layers 133, 140 relative to a porous surface characteristic of the major surfaces 132, 134 of the MIO bonding structure 130. In this instance, a planar surface of the second surface 114 abuts against and contacts a corresponding planar surface of the solid metal cap layer 133 (i.e. the top interface surface 131) for bonding at block 214, thereby strengthening an adhesion between the semiconductor device 110 and the MIO bonding structure 130 during a bonding of the assembly 100. Further, a planar surface of the first surface 122 abuts against and contacts a corresponding planar surface of the solid metal base layer 140 (i.e. the bottom interface surface 144) for bonding at block 214, thereby strengthening an adhesion between the substrate 120 and the MIO bonding structure 130 during a bonding of the assembly 100.

It should now be understood that the methods for fabricating an electronic assembly, and in particular bonding a semiconductor device to a metal substrate with a pair of solid metal layers disposed about a metal inverse opal structure positioned therebetween, may be utilized to promote an adhesion of the semiconductor device and the metal substrate to the metal inverse opal structure. In particular, the integration of one or more polymer spheres along the metal substrate and application of a variable current density during an electroplating process of the fabrication method described herein may provide a simplified method for forming solid metal layers and securing assembly components to one another with a porous interlayer (e.g., an MIO bonding structure).

It is noted that the term "about" and "generally" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue. The terms "top", "bottom" and "middle" are used in relation to the figures and are not meant to define an exact orientation of power electronics assemblies or layers used to form power electronic assemblies described herein.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method of forming an inverse opal structure along a metal substrate comprising:

depositing a plurality of polymer spheres along the metal substrate;

electroplating the metal substrate and the plurality of polymer spheres at a first current density to form a first solid metal layer between the metal substrate and the plurality of polymer spheres such that the plurality of polymer spheres is raised from the metal substrate;

electroplating the metal substrate and the plurality of polymer spheres at a second current density to diffuse metals from the metal substrate and deposit the metals about the plurality of polymer spheres, wherein the second current density is greater than the first current density;

electroplating the metal substrate and the plurality of polymer spheres to form a second solid metal layer disposed over the plurality of polymer spheres; and removing the plurality of polymer spheres to form the inverse opal structure disposed between the first solid metal layer and the second solid metal layer and having a porous structure, wherein the first solid metal layer and the second solid metal layer define planar interface surfaces disposed over the porous structure of the inverse opal structure.

2. The method of claim 1, wherein the first solid metal layer formed when electroplating at the first current density includes a thickness that is relatively smaller than the second solid metal layer formed.

3. The method of claim 1, further comprising bonding a semiconductor device to the inverse opal structure by depositing the semiconductor device over the second solid metal layer.

4. The method of claim 1, further comprising ceasing of the electroplating at the first current density after a predetermined duration to control a thickness of the first solid metal layer.

5. The method of claim 1, further comprising selectively adjusting a thickness of the first solid metal layer along the metal substrate by manipulating a predetermined duration of electroplating at the first current density.

6. The method of claim 5, wherein the predetermination duration is less than or equal to approximately ten minutes.

7. The method of claim 1, further comprising attaching a cooling structure to the inverse opal structure such that the first solid metal layer and the second solid metal layer are coupled to the cooling structure via the inverse opal structure.

8. The method of claim 1, wherein electroplating the metal substrate and the plurality of polymer spheres at the first current density to form the first solid metal layer forms a heat spreader configured to inhibit hot spots generated therebetween.

9. The method of claim 1, further comprising forming a plurality of pores along the metal substrate when removing the plurality of polymer of spheres from the metal substrate.

10. The method of claim 1, wherein removing the plurality of polymer spheres comprises dissolving the plurality of polymer spheres with a solution.

11. The method of claim 1, wherein the first current density is less than or equal to approximately 50 milliampere per square centimeter ($mA/cm^2$).

12. The method of claim 1, wherein the second current density is greater than or equal to approximately 100 milliampere per square centimeter ($mA/cm^2$).

13. A method for bonding a semiconductor device to a metal substrate, the method comprising:
receiving a plurality of polymer spheres along the metal substrate;
electroplating the metal substrate at a low current density to form a first solid metal layer between the plurality of polymer spheres and the metal substrate such that the plurality of polymer spheres are lifted off the metal substrate;
electroplating the metal substrate at a high current density to diffuse metal from the metal substrate and onto the plurality of polymer spheres such that an interconnected network of pores are formed over the first solid metal layer;
electroplating the metal substrate to form a second solid metal layer over the plurality of polymer spheres such that the plurality of polymer spheres are disposed between the first solid metal layer and the second solid metal layer;
removing the plurality of polymer spheres to expose an inverse opal structure disposed within the interconnected network of pores such that the inverse opal structure is positioned between the first solid metal layer and the second solid metal layer, wherein the first solid metal layer and the second solid metal layer form planar interface surfaces about the inverse opal structure; and
depositing the semiconductor device onto the second solid metal layer.

14. The method of claim 13, further comprising bonding the semiconductor device to the second solid metal layer.

15. The method of claim 13, wherein the first solid metal layer and the second solid metal layer are integrally formed with the inverse opal structure and the metal substrate.

16. A method of forming a power electronic assembly, the method comprising:
positioning a plurality of polymer spheres against a metal substrate;
electroplating the metal substrate at a low current density to diffuse metal therefrom, wherein the metal are deposited underneath the plurality of polymer spheres thereby forming a first solid metal layer on the metal substrate such that the plurality of polymer spheres are lifted relative to the metal substrate;
electroplating the metal substrate at a high current density to diffuse metal therefrom, wherein the metal are deposited about the plurality of polymer spheres thereby enclosing the plurality of polymer spheres therein;
electroplating the metal substrate to diffuse metal ions therefrom, wherein the metal ions are deposited over the plurality of polymer spheres thereby forming a second solid metal layer on the plurality of polymer spheres such that the plurality of polymer spheres are disposed between the first solid metal layer and the second solid metal layer;
removing the plurality of polymer spheres to form an inverse opal structure disposed therein and positioned between the first solid metal layer and the second solid metal layer;
placing a semiconductor device onto a planar interface surface of the second solid metal layer.

17. The method of claim 16, further comprising forming a plurality of pores between the first solid metal layer and the second solid metal layer when removing the plurality of polymer of spheres, wherein removing the plurality of polymer spheres comprises dissolving the plurality of polymer spheres with a solution.

18. The method of claim 16, wherein the low current density is less than or equal to approximately 50 milliampere per square centimeter ($mA/cm^2$).

19. The method of claim 16, wherein the high current density is greater than or equal to approximately 100 milliampere per square centimeter ($mA/cm^2$).

* * * * *